(12) United States Patent
Chan et al.

(10) Patent No.: US 6,518,096 B2
(45) Date of Patent: Feb. 11, 2003

(54) INTERCONNECT ASSEMBLY AND Z-CONNECTION METHOD FOR FINE PITCH SUBSTRATES

(75) Inventors: Albert W. Chan, Cupertino, CA (US); Michael G. Lee, San Jose, CA (US)

(73) Assignee: Fujitsu Limited (JP)

(*) Notice: Subject to any disclaimer, the term of this patent is extended or adjusted under 35 U.S.C. 154(b) by 0 days.

(21) Appl. No.: 09/757,005

(22) Filed: Jan. 8, 2001

(65) Prior Publication Data
US 2002/0090754 A1 Jul. 11, 2002

(51) Int. Cl.[7] ............................................. H01L 21/44
(52) U.S. Cl. ..................... 438/118; 438/108; 438/127
(58) Field of Search ............................. 438/108, 118, 438/127; 257/778

(56) References Cited

U.S. PATENT DOCUMENTS

| | | |
|---|---|---|
| 4,323,659 A | 4/1982 | Watanabe et al. |
| 4,477,512 A | 10/1984 | Thomas et al. |
| 5,075,155 A | 12/1991 | Jellinek et al. |
| 5,641,996 A | 6/1997 | Omoya et al. |
| 5,807,959 A | 9/1998 | Wu et al. |
| 5,843,251 A | 12/1998 | Tsukagoshi et al. |
| 5,945,258 A | 8/1999 | Shimizu et al. |
| 5,981,312 A * | 11/1999 | Farquhar et al. ............. 438/112 |
| 6,054,761 A | 4/2000 | McCormack et al. |
| 6,069,024 A * | 5/2000 | Murakami ..................... 438/108 |
| 6,106,891 A | 8/2000 | Kulesza et al. |

FOREIGN PATENT DOCUMENTS

JP 05318483 * 12/1993

* cited by examiner

Primary Examiner—Michael Sherry
Assistant Examiner—Scott Geyer
(74) Attorney, Agent, or Firm—Coudert Brothers LLP

(57) ABSTRACT

An interconnect assembly and a fluxless method for forming the interconnect assembly. The fluxless method includes providing a first semiconductor substrate having a first pad connected thereto. A post is connected to the first pad and includes a length greater than a thickness of the first pad, and a metallic solder disposed on an associated end of the post. A second semiconductor substrate is provided as having a second pad connected thereto. The fluxless method further includes depositing an unfilled polymeric liquid on the second pad, aligning and contacting the metallic solder with the unfilled polymeric liquid, and forcing by pressure the first and second semiconductor substrate toward each while simultaneously heating the metallic solder and the unfilled polymeric liquid to form a metallurgical joint between the second pad and the metallic solder.

26 Claims, 2 Drawing Sheets

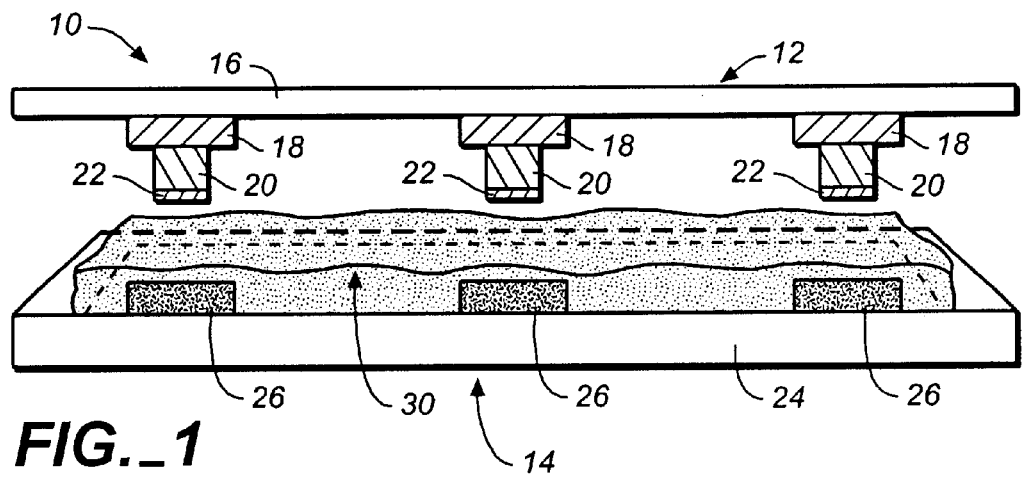
FIG._1
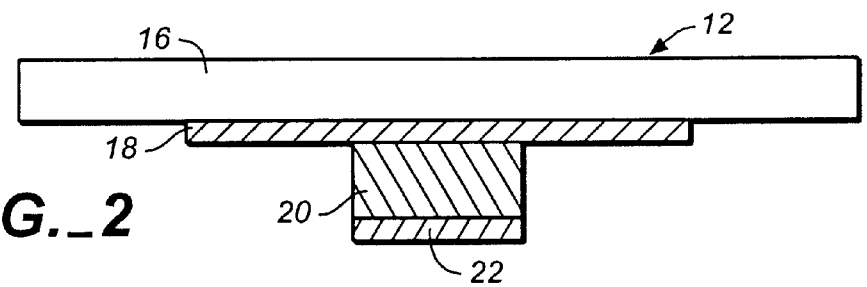
FIG._2
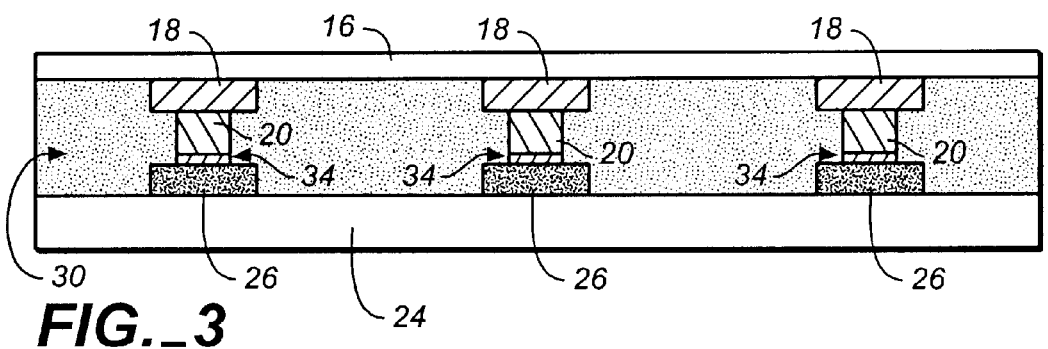
FIG._3

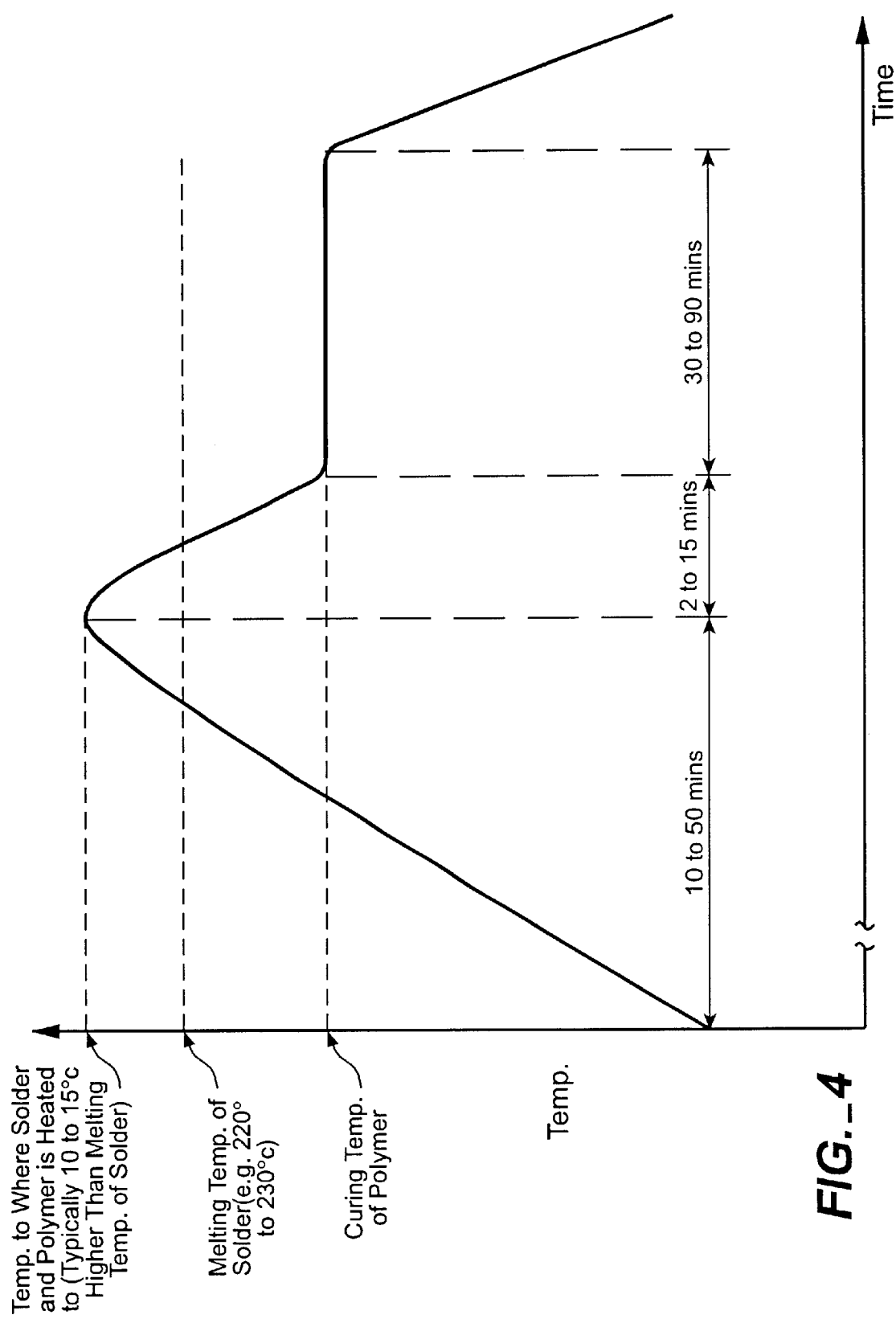
FIG._4

INTERCONNECT ASSEMBLY AND Z-CONNECTION METHOD FOR FINE PITCH SUBSTRATES

BACKGROUND OF THE INVENTION

1. Field of the Invention

The present invention relates to methods of fabricating semiconductor devices. More specifically, embodiments of the present invention provide an interconnect assembly and Z-connection method for coupling together fine pitch substrates.

2. Description of the Prior Art

Multi-chip modules (MCM) are substrates on which more than one integrated circuit chip is mounted. The substrate (e.g., a chip carrier) typically includes bonding pads for the chip, where the pads may be connected by a set of conductive lines to contact pads for a package or to other bonding pads on the substrate. The conductive lines thus form an interconnect network or I/O path for multiple elements mounted on a common substrate. Although there are other methods for electrically connecting an integrated circuit chip or other component to a substrate, the most commonly used ones are termed flip-chip bonding, wire bonding, and tape automated bonding (TAB).

In flip-chip (or solder bump) bonding, solder bumps are placed on the I/O pads of a chip and reflowed to form a bond with the chip pads. The chip is placed on a holder in a face-up position, flipped over (i.e., face-down) and aligned with the corresponding conductive bonding pads on the substrate. The chip pads and substrate pads are then brought into physical contact. The solder is reflowed by application of heat, causing the bumps to fuse with the bonding pads and provide both an electrical and structural connection between the chip's I/O pads and the substrate. In wire bonding processes, the chips are attached to the substrate in a face-up position and thin gold or aluminum wires are then connected between the I/O pads of the chip and the bonding pads of the substrate. The wires are connected to the two sets of pads by means of a thermocompresison, thermosonic, or ultrasonic welding operation. In TAB bonding, the chips are attached to the substrate in a face-up position and the I/O pads of the chips are then bonded to metal pads on a polyimide film tape by either reflowing or thermocompression/ultrasonic bonding metal and/or solder bumps placed on the tape.

Each of the described methods for interconnecting chips to a substrate has its associated advantages and disadvantages. Flip-chip methods provide the highest density of I/O interconnects and therefore the capability of producing the smallest MCMs. The I/O connections may be made at the periphery of the chip or in its interior. The flip-chip bonds provide a good electrical connection, but the solder joints generally exhibit poor heat dissipation capability (low thermal conductivity). Another disadvantage is that the integrity of the solder joint between the pads can be reduced by thermally induced metal fatigue (differential thermal expansion between the components), and by corrosion caused by trapped solder flux or contaminants. Shorting between closely spaced bumps can occur when the solder is reflowed. In addition, because the solder must be heated to a sufficient temperature to cause it to reflow, flip-chip bonding may not be suited for use with some temperature sensitive components (i.e., components which are damaged, or have their electrical characteristics unacceptably altered when heated to solder reflow temperatures).

Wire bonding is a mature technology, however, the wires used in wire bonding are purposefully made very thin, thereby limiting the power they can transfer without failure. In addition, the lead inductance and resistance of the wires result in a degradation of the electrical performance of the interconnects. Wire bond connections have a larger footprint than flip-chip interconnects, and thus require a comparatively larger substrate than flip-chip bonded MCMs. The wires also form a relatively long signal propagation path compared to other interconnect methods, In addition, embrittlement of the interconnections as a result of the formation of intermetallics can cause a failure of the bonds (e.g., this is a problem between gold wirebonds and aluminum pads).

TAB interconnections offer the benefits of a smaller bonding pad and pitch than wire bonding. However, like wire bonding, TAB is limited to the interconnection of chips having perimeter I/O pads. This typically results in a lower overall I/O density than can be obtained using flip-chip technologies. TAB interconnects also generally have a higher capacitance and greater parasitic inductance than do flip-chip bonds. Finally, because TAB assembly usually requires different tooling for each chip design, TAB is relatively expensive bonding method. Therefore, what is desired and what has been invented is a method for interconnecting integrated circuit chips to a substrate which overcomes some of the disadvantages of presently available methods, while retaining many of the benefits of those methods. It is particularly desired to have a method for interconnecting chips to a substrate which has the benefits of flip-chip bonding, without the drawbacks of that method.

SUMMARY OF THE INVENTION

The present invention provides a fluxless method for forming an interconnect assembly comprising a first semiconductor substrate having a first pad connected thereto, and a post connected to the first pad and having a length greater than a thickness of the first pad. A metallic solder is disposed on an end of the post, and a second semiconductor substrate is provided having a second pad connected thereto. The length of the post is preferably from about five to about eight times greater than the thickness of the first pad. The thickness of the first pad ranges from about 4 microns to about 7 microns and the length of the post ranges from about 20 microns to about 56 microns. The fluxless method also includes depositing an unfilled polymeric liquid on the second pad; aligning and contacting the metallic solder with the unfilled polymeric liquid; and forcing by pressure the first and second semiconductor substrates toward each while simultaneously heating the metallic solder and the unfilled polymeric liquid to form a metallurgical joint between the second pad and the metallic solder.

The unfilled polymeric liquid preferably comprises, consists essentially of, or consists of from about 96% by weight to about 98% by weight of an epoxy resin and from about 2% by weight to about 4% by weight of an imidazole catalyst. Alternatively, unfilled polymeric liquid preferably comprises, consists essentially of or consists of from about 60% by weight to about 90% by weight of an epoxy resin; from about 8% by weight to about 36% by weight of a novolac resin; and from about 2% by weight to about 4% by weight of an imidazole catalyst. The unfilled polymeric liquid remains a liquid while the metallic solder is being aligned and contacted with the unfilled polymeric liquid.

The forcing by pressure of the first and second substrates toward each other preferably comprises passing the metallic solder through the unfilled polymeric liquid and contacting the second pad with the metallic solder with a pressure ranging from about 200 psi to about 500 psi, preferably from about 300 psi to about 400 psi. The heating of the metallic solder and the unfilled polymeric liquid preferably comprises increasing the temperature of the metallic solder until the temperature of the metallic solder is greater than its melting temperature; and subsequently decreasing the temperature of the metallic solder and the unfilled polymeric liquid until the temperature approximates the curing temperature of the unfilled polymeric liquid. Increasing the temperature of the metallic solder preferably comprises continually increasing the temperature for a period of time ranging from about 10 minutes to about 50 minutes; and the decreasing of the temperature of the metallic solder comprises continually decreasing the temperature for a period of time ranging from about 2 minutes to about 15 minutes until the temperature reaches around the curing temperature of the unfilled polymeric liquid where it is maintained for a period of time ranging from about 30 minutes to about 90 minutes.

In another embodiment of the present invention there is provided a fluxless method for forming an interconnect assembly comprising providing a first semiconductor substrate having connected thereto a first pad and a second pad spaced from the first pad at a distance of less than about 0.20 mm. A first post and a second post are respectively connected to the first pad and to the second pad, and a metallic solder is disposed on an end of the first post and on an end of the second post. The fluxless method also includes providing a second semiconductor substrate having connected thereto a second first pad and a second second pad. The latter pad is spaced less than about 0.20 mm from the second first pad. The fluxless method also includes depositing an unfilled polymeric liquid on the second first pad and on the second second pad. The respective metallic solders on the ends of the first and second posts are aligned with and contact the second first pad and the second second pad; and the first and second semiconductor substrates are forced by pressure toward each other while simultaneously heating the respective metallic solders and unfilled polymeric liquid to form a metallurgical joint between the respective metallic solders and the second first pad and the second second pad. In one preferred embodiment, the unfilled polymeric liquid comprises, consists essentially of, or consists of from about 96% by weight to about 98% by weight of an epoxy resin and from about 2% by weight to about 4% by weight of an imidazole catalyst. In another preferred embodiment, the unfilled polymeric liquid comprises, consists essentially of, or consists of from about 60% by weight to about 90% by weight of an epoxy resin; from about 8% by weight to about 36% by weight of a novolac resin; and from about 2% by weight to about 4% by weight of an imidazole catalyst.

Preferably, the unfilled polymeric liquid remains a liquid while the metallic solder is being aligned and contacted with the unfilled polymeric liquid. The forcing by pressure of the first and second substrates toward each other comprises passing the metallic solder through the unfilled polymeric liquid and contacting the second first pad and the second second pad with the respective metallic solders with a pressure ranging from about 200 psi to about 500 psi. As previously indicated, the heating of the metallic solder and the unfilled polymeric liquid comprises increasing the temperature of the metallic solder until the temperature of the metallic solder is greater than its melting temperature, and subsequently decreasing the temperature of the metallic solder and the unfilled polymeric liquid preferably comprises decreasing the temperature until the temperature approximates the curing temperature of the unfilled polymeric liquid. As also previously indicated, increasing the temperature preferably comprises continually increasing the temperature for a period of time ranging from about 10 minutes to about 50 minutes; and the decreasing of the temperature preferably comprises continually decreasing the temperature for a period of time ranging from about 2 minutes to about 15 minutes until the temperature reaches around the curing temperature of the unfilled polymeric liquid where it is maintained for a period of time ranging from about 30 minutes to about 90 minutes.

Embodiments of the present invention also provide an interconnect assembly comprising a first semiconductor substrate; a first pad secured to the first substrate; and a second pad secured to the first substrate and spaced from the first pad at a pitch having a value less than about 0.20 mm. The interconnect assembly also includes a semiconductor substrate having a second first pad and a second second pad secured thereto with the second second pad spaced from the second first pad at a pitch having a value less than about 0.20 mm. A first post is connected to the first pad and to the second first pad through a first metallurgical joint; and a second post is connected to the second pad and to the second second pad through a second metallurgical joint. A first cured polymeric liquid is in contact with at least a portion of the first metallurgical joint; and a second cured polymeric liquid is in contact with at least a portion of the second metallurgical joint. The first pad has a first thickness and the second pad has a second thickness. The first post has a length which is from about five to about eight times greater than the first thickness. The second post has a length which is from about five to about eight times greater than the second thickness.

These provisions together with the various ancillary provisions and features which will become apparent to those skilled in the art as the following description proceeds, are attained by the methods and assemblies of the present invention, preferred embodiments thereof being shown with reference to the accompanying drawings, by way of example only, wherein:

BRIEF DESCRIPTION OF THE DRAWINGS

FIG. 1 is a partial perspective segmented view of one embodiment of the interconnect assembly;

FIG. 2 is a side elevational view of part of the interconnect assembly illustrating a semiconductor substrate, a pad connected to the substrate, a post connected to the pad, and metallic solder disposed at the end of the post;

FIG. 3 is a side elevational view of the interconnect assembly; and

FIG. 4 is a schematic graph of a temperature profile for heating the solder and polymer, and for subsequently decreasing the temperature of the solder and the polymer until the curing temperature of the polymer is reached where it is maintained for a period of time ranging from about 30 minutes to about 90 minutes.

DETAILED DESCRIPTION OF PREFERRED EMBODIMENTS OF THE INVENTION

Referring in detail now to the drawings, there is seen in FIG. 1 a partial perspective segmented view of the interconnect assembly, generally illustrated as 10. Interconnect assembly 10 comprises substrate assembly 12 and substrate assembly 14. As best shown in FIG. 2, substrate assembly 12 includes substrate 16, pads 18 secured to the substrate 16, a post 20 secured to each of the pads 18, and a metallic solder 22 mounted to each of the available ends of the posts 20.

/Substrate assembly 14, as best shown in FIG. 1, includes substrate 24, and pads 26 secured to the substrate 24. A polymer, generally illustrated as 30, is disposed on one of the substrates 16 and 24, preferably substrate 24 as shown in FIG. 1.

The substrates 16 and 24 may be any suitable substrates which are to be electrically interconnected to form part of the interconnect assembly 10. Suitable substrates include semiconductor substrates, any circuitized substrate, or the like, including suitable electrical substrates or electrical layers, such as $PCB_S$ (IC boards), $MCM_S$, back planes, $LSI_S$, personal computers, workstations, computers (including their peripheral devices), terminals, semiconductor chip, CSP, MCM, PCB, or any of the like, etc.

Pads 18 and 26 may be any suitable pads or electrodes which are respectively electrically coupled or connected to the substrate 16 and 24. The thickness or height of each of the pads 18 and 26 is of such a thickness or height that would enable the length of the respective posts 20 to be from about five (5) to about eight (8) times greater than the thickness or height of the respective pads 18 and 26. Preferably, the thickness or height of the respective pads 18 and 26 ranges from about 4 microns to about 7 microns, more preferably from about 5 microns to about 6 microns. Thus, the length of the respective posts 20 ranges from about 20 microns to about 56 microns, more preferably from about 25 microns to about 48 microns. The pads 18, as well as pads 26, are spaced from each other at a distance less than about 0.20 mm, preferably at a distance less than about 0.18 mm, more preferable at a distance ranging from about 0.10 mm to about 0.16 mm (e.g., about 0.15 mm). The pads 18 and 26 may each be made of or constructed from any suitable conductive material, such as a conductive metallic element, compound or alloy, preferably copper.

The metallic solder 22 which is mounted to or secured to each of the available ends of the posts 20 is preferably a metallic solder 22 having a melting temperature (e.g., from about 200° C. to about 240° C., preferably 220° C. to about 230°) that is from about 50° C. to about 90° C. (preferably from about 70° C. to about 80° C.) higher than the curing temperature of the unfilled polymeric liquid 30. Preferably, metallic solder comprises, consists essentially of, or consists of eutectic Pb/Sn, preferably 95Sn/5Sb or 80Au/20Sn. The metallic solder 22 preferably has a thickness ranging from about 0.10 microns to about 2.0 microns, more preferably 0.60 microns to about 0.90 microns.

The polymer 30 is preferably an unfilled polymer; that is, a polymer not containing any filler particles, such as silica, silica oxides, alumina oxides, aluminum nitrides, silicon carbides, calcium carbonate, mica or any of the like. The polymer 30 is preferably a catalytic cured polymer, as opposed to being cured with an amine or anhydride, and has a higher temperature resistance and a lower moisture absorption than when cured with an amine or anhydride. In a preferred embodiment of the invention the polymer 30 comprises, or consists essentially of, or consists of, a catalyst (e.g., an imidazole catalyst); and an epoxy (e.g., an epoxy resin). Preferably, the polymer 30 comprises, or consists essentially of, or consists of, from about 90% by weight to about 99% by weight of epoxy resin and from about 1% by weight to about 10% by weight of the catalyst, preferably from about 95% by weight to about 99% by weight of the epoxy resin and from about 1% by weight to about 5% by weight of the catalyst, more preferably from about 96% by weight to about 98% by weight of the epoxy resin and from about 2% by weight to about 4% by weight of the catalyst. In another embodiment of the present invention, the polymer 30 comprises, or consists essentially of, or consists of, a catalyst (e.g., an imidazole catalyst); an epoxy (e.g. an epoxy resin); and a novolac resin. For this embodiment of the invention, the polymer 30 comprises, or consists essentially of, or consists of, from about 25% by weight to about 95% by weight of epoxy resin, and from about 5% by weight to about 75% by weight novolac resin and from about 1% by weight catalyst, preferably from about 40% by weight to about 95% by weight of epoxy resin and from about 5% by weight to about 50% by weight novolac resin and from about 1% by weight to about 6% by weight catalyst, more preferably from about 60% by weight to about 90% by weight of epoxy resin and from about 8% by weight to about 36% by weight of novolac resin, and from about 2% by weight to about 4% by weight catalyst. Embodiments of the polymer 30 of the present invention have good thermal stability. TGA measurements of the polymer 30 show an onset decomposition temperature of close to about 300° C. This thermal stability is necessary for higher reflow temperatures for lead free solders 22 where JEDEC level 2 reflows are needed, e.g., where there is peak temperatures of about 250° C. to about 270° C., such as about 260° C., and especially for temperatures which remain for at least 4 minutes above about 220° C., such as about 245° C. In addition to the thermal stability, no volatiles are evolved from the polymer 30 during the initial heating to reflow temperatures of about 245° C. to about 250 C. for the metallic solder 22.

The epoxy resin for the polymer 30 is preferably a thermosetting resin based on the reactivity of the epoxide group, such as a bisphenol, an epoxy resin made from epichlorohydrin and bisphenol A. As set forth in U.S. Pat. No. 4,477,518, incorporated herein by reference thereto, epoxy resins include glycidyl polyethers, whose principal structure may be represented by the chemical formula:

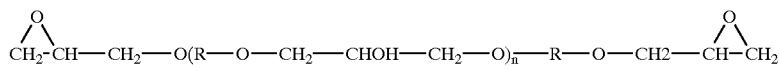

where n is an integer of the series 0, 1, 2, 3 . . . , and R represents the divalent hydrocarbon radical of the dihydric phenol. Preferably, R is derived from bisphenol A. These bisphenol type epoxy resins have a 1,2 epoxy equivalency greater than one. They will generally be diepoxides. By the term "epoxy equivalent", is mean the number of 1, 2 epoxy groups,

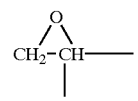

contained in the average molecule of the glycidylether. Typically, epoxy resins of bisphenol are readily available in commercial quantities and reference may be made to the *Handbook of Epoxy Resins*, by Lee and Neville, for a complete description of their synthesis.

The novolac resin for the polymer 30 is a thermoplastic phenol-formaldehyde type resin obtained primarily by the use of acid catalysts and excess phenol. It is generally alcohol-soluble and requires reaction with hexamethylenetetramine, paraformaldehyde, etc. for conversion to cured, cross-linked structures by heating to 200–400° F. Suitable novolac epoxy resins are commercially available and include novolac epoxy resins obtained by reacting, preferably in the presence of basic catalyst such as sodium hydroxide, an epihalohydrin such as epichlorohydrin with a novolac resin. Novolac resins are the resinous condensate of an aldehyde such as formaldehyde, and either a monohydric phenol, dihydric or a polyhydric phenol. The dihydric phenols include phenols substituted with one or more groups selected from: hydrogen, bromine and chlorine and wherein the aromatic rings are joined by: an alkylene (e.g., methylene) or alkylidene (e.g., isopropylidene), group having from about 1 to about 4 carbon atoms, S, S—S, SO, $SO_2$, CO, or O (see U.S. Pat. No. 6,106,891 incorporated herein by reference thereto).

Suitable novolacs are derived from the following phenols: phenol, cresol, alpha and beta-naphthol, o-, m-, or p-chlorophenol, alkylated derivatives of phenol, including for example, o-methyl-phenol, 3,5-dimethyl-phenol, p-t-butyl-phenol and p-nonylphenol and other monohydric phenols, as well as polyhydric phenols, such a resorcinol and yhydroquinone. The polyhydric phenols having from 2 to 6 hydroxyl groups and having from 6 to about 30 carbon atoms are particularly useful in the reaction with epoxy resins to form either linear or cross-linked high molecular weight resins. Novolacs derived from polyhydric phenols include for example, phenol which contain substituted groups including halogen (fluoro, chloro or bromo or hydrocarbyl and the aromatic rings are joined by a group selected from: oxygen, sulfur, SO, $SO_2$, bivalent hydrocarbon radicals containing up to 10 carbon atoms, and oxygen, sulfur and nitrogen containing hydrocarbon radicals, such as: OR'O, OR'OR'O, SR's, SR'SR'S, OSiO, OSiOSiO, OCOR'COO, COOR'COO, SOR'SO and $SO_2R'SO_2$ radicals wherein R' is a bivalent hydrocarbon radical.

An illustrative, but by no means exhaustive listing of suitable dihydric phenols includes 4,4'-dihydroxydiphenylmethylmethane, (Bis-phenol A), 2,4'-dihydroxydiphenylmethylmethane, 3,3'-dihydroxydiphenyldiethylmethane, 3,4'-dihydroxydiphenylmethylpropylmethane, 2,3'-dihydroxydiphenylethylphenylmethane, 4,4'-dihydroxydiphenylpropylphenylmethane, 4,4'-dihydroxydiphenylbutylphenylmethane, 2,2'-dihydroxydiphenylditolylmethane, 4,4'-dihydroxydiphenyltolymethylmethane, and the like.

The catalyst for the polymer 30 may be any suitable catalyst which is added in an effective amount to promote the crosslinking of the epoxy resin. Suitable catalysts for the epoxy resins include, for example, amines such as the tertiary amines and acidic catalysts such as stannous octoate, and imidazoles. Suitable tertiary amine catalysts include N,N-dimethylbenzylamine, triethylamine, N,N dimethylaniline, N-methylmorpoline, N-ethylmorpholine, imidazole and tetrachloromethyl ethylene amine, tetramethyl guanidine, triisopropylamine, pyridine, piperrazine, triethyamine, tributylamine, dimethyl benzylamine, triphenyl amine, tricyclohexylamine, quinoline, triethylamines, triphenylamine, tri(2,3-dimethyl cyclohexyl) amine, benzyldimethylamine, 1,3-tetramethyl butane diamine, tris (dimethylaminomethyl) phenol, and triethylenediamine. Suitable imidazoles have one or more alkyl of 1 to 6 carbon atoms or aryl which can be positioned on the amino nitrogen or heterocyclic carbons.

Suitable imidazoles include, for example imidazole, 2-methylimidazole, 2-ethylimidazole, 2-propylimidazole, 2-butylimidazole, 2-pentylimidazole, 2-hexylimidazole, 2-cyclohexylimidazole, 2-phenylimidazole, 2-nonylimidazole, 2-undecylimidazole, 2-heptadecylimidazole, 2-ethyl-4-methylimidazole, 2-phenyl-4-methylimidazole, 1-benzylimidazole, 1-ethyl-2methylbenzimidazole, 2-methyl 5,6-benzimidazole, 1 vinylimidazole, 1-allyl-2-methylimidazole, 2-cyanoimidazole, 2-cyanoimidazole, 2-chloroimidazole, 2-bromoimidazole, and combinations thereof. Other imidazoles containing oxygen, sulfur or halogen or the like substituents include for example, 1-(2-hydroxypropyl)-2methylimidazole, 2-phenyl-4,5-dimethylolimidazole, 2-phenyl-4-methyl-5-hydroxymethylimidazole, 2-chloromethylbenzimidazole, 2-hydroxybenzimidazole, and any combination thereof. Most particularly suitable imidazoles are 2-methylimidazole, 2-ethyl-4-methylimidazole, 1,2-dimethylimidazole and 2-phenylimidazole, 2-phenyl-4,5-dihydroxymethylimidazole, 2-phenyl-4 -methylimidazole, 1-cyanaoethyl-2-methyimidazole, 1-cyanoethyl-2-phenylimidazole, 3,4-dialkyl imidazoles are preferred since they provide accelerated and advanced cure of the epoxy reaction at moderate temperature and provide cured materials with the highest heat distortion temperatures.

Continuing to refer now to FIGS. 1–4 for the method for forming an interconnect assembly, the method is preferably without flux. As is well known in the art, vapor deposition may be employed to dispose a layer of the soldering material to form metallic solder 22, which typically has an oxide layer on the surface as a result of air contact. As will be further set forth below, when the metallic solder 22 is heated to its softening or melting temperature ("reflow temperature"), the heating may be conducted while the respective metallic solders 22 have been inserted into the polymer 30 (e.g., liquid polymer 30) and placed in contact with respective pads 26. Heating may also be conducted in atmospheric gas consisting of nitrogen and/or argon. The melting or reflow temperature of the metallic solder 22 is lower than that of the pads 18 and 26, as well as posts 20. Thus, after liquid polymer 30 has been deposited on the substrate 24 such that pads 26 are superimposed with and/or covered with liquid polymer 30, substrate 16 (including the associated posts 20 and metallic solder 22) is aligned with the liquid polymer 30 including the pads 26, such that when the substrates 16 and 24 are forced towards each other, while the respective metallic solders 22 are in contact with the respective pads 26, and while heating of the metallic solders 22 and the liquid polymer 30 is simultaneously taking place. The melting temperature of the metallic solder 22 may typically range from about 220° C. to about 230° C. The peak heating temperature may typically range from about 5° C. to about 25° C. higher than the melting temperatures. Metallurgical joints 34 (see FIG. 3) form for fusing respective ends of posts 20 to respective pads 26. More specifically, ends of the respective posts 20 and the associated metallic solders 22 are passed through liquid polymer 30 and placed in contact with respective pads 26. Subsequently, substrates 16 and 24 are forced towards each other, preferably at a pressure ranging from about 200 psi to about 500 psi, while simultaneously heating of the metallic solders 22 and the unfilled polymeric liquid 30 is taking place, as best shown in FIG. 4. Heating of the metallic solder 22 includes increasing the temperature of the metallic solders 22 until the temperature of the metallic solders 22 is greater than the melting temperature in the metallic solders 22. Subsequently, the temperature of the metallic solders 22 and the unfilled polymeric liquid 30 is decreased until the temperature is around the curing temperature (e.g., 130° C. to 190° C.) of the unfilled polymeric liquid 30. In a preferred embodiment of the invention, increasing the temperature preferably comprises continually increasing the temperature for a period of time ranging from about 10 minutes to about 50 minutes (see FIG. 4); and decreasing the temperature preferably comprises continually decreasing the temperature for a period of time ranging from about 2 minutes to about 15 minutes until the temperature reaches around the curing temperature of the unfilled polymeric liquid 30 where it is maintained for a period of time ranging from about 30 minutes to about 90 minutes to allow the unfilled polymeric liquid 30 to cure.

Thus, by the practice of the present invention, there is provided a Z-connection assembly that may be used to establish electrical connectivity between two substrates, e.g., substrates 16 and 24. As shown in FIG. 1, the electrical connection between the substrates 16 and 24 is accomplished through metallurgical joints 34 formed between solder tipped posts 20 (e.g., copper posts) and pads 26 (e.g., copper pads) on the matching substrate. A polymer composition is dispensed on one substrate (e.g., the substrate with matching copper pads), followed by alignment and substrate touch-down. The substrates may subsequently be laminated or heat pressed to melt the solder and form the metallurgical joint between the posts and pads. During this heating, the polymer composition undergoes cure and solidifies. As previously indicated, FIG. 2 shows the detail of the solder tipped copper post, while FIG. 3 shows the joined substrates after completion of Z-connection. The polymer composition, after cure, serves as the dielectric layer. This layer relieves stresses during the thermal cycling and provides semi-hermetic sealing of metal contacts from the environment.

Embodiments of the present invention provide a convenient route for establishing electrical contact between substrates for fine pitch (e.g., pitches less than about 0.20 mm) packaging applications. Use of solder tipped posts allows for higher density routing and also maintains component reliability since a metallurgical joint is established. By using the dispensable liquid polymer composition of the present invention, the Z-connection process is simplified. Conventional equipment for attaching flip chips to substrates can be used for alignment and substrates touch-down. The polymer composition also eliminates the need for subsequent underfill after Z-connection is completed. It is to be understood that the underfill is optional after the Z-connection has been made.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention without departing from the essential scope and spirit of the present invention. It is intended that the invention not be limited too the particular embodiment disclosed as the best mode contemplated for carrying out this invention, but that the invention will include all embodiments and equivalents falling within the scope of the appended claims.

What is claimed is:

1. A fluxless method for forming an interconnect assembly comprising:
   providing a first semiconductor substrate having a first pad connected thereto, a post connected to the first pad and having a length greater than a thickness of the first pad, a metallic solder disposed on an end of the post;
   providing a second semiconductor substrate having a second pad connected thereto; depositing an unfilled polymeric liquid on the second pad;
   aligning and contacting the metallic solder with the unfilled polymeric liquid; and
   forcing by pressure the first and second semiconductor substrates toward each while simultaneously heating the metallic solder and the unfilled polymeric liquid to form a metallurgical joint between the second pad and the metallic solder, wherein said heating the metallic solder and the unfilled polymeric liquid comprises increasing the temperature of the metallic solder until the temperature of the metallic solder is greater than its melting temperature; and subsequently decreasing the temperature of the metallic solder and the unfilled polymeric liquid until the temperature is around the curing temperature of the unfilled polymeric liquid.

2. The fluxless method of claim 1 wherein said unfilled polymeric liquid consists essentially of from about 96% by weight to about 98% by weight of an epoxy resin and from about 2% by weight to about 4% by weight of an imidazole catalyst.

3. The fluxless method of claim 2 wherein said unfilled polymeric liquid remains a liquid while said metallic solder is being aligned and contacted with the unfilled polymeric liquid.

4. The fluxless method of claim 3 wherein said forcing by pressure the first and second substrate toward each other comprises passing the metallic solder through the unfilled polymeric liquid and contacting the second pad with the metallic solder with a pressure ranging from about 200 psi to about 500 psi.

5. The fluxless method of claim 4 wherein said increasing the temperature comprises continually increasing the temperature for a period of time ranging from about 10 minutes to about 50 minutes; and said decreasing the temperature comprises continually decreasing the temperature for a period of time ranging from about 2 minutes to about 15 minutes until the temperature reaches around the curing temperature of the unfilled polymeric liquid where it is maintained for a period of time ranging from about 30 minutes to about 90 minutes.

6. The fluxless method of claim 5 wherein said length of the post is from about five to about eight times greater than the thickness of the first pad.

7. The fluxless method of claim 1 wherein said unfilled polymeric liquid consists essentially of from about 60% by weight to about 90% by weight of an epoxy resin; from about 8% by weight to about 36% by weight of a novolac resin; and from about 2% by weight to about 4% by weight of an imidazole catalyst.

8. The fluxless method of claim 1 wherein said unfilled polymeric liquid remains a liquid while said metallic solder is being aligned and contacted with the unfilled polymeric liquid.

9. The fluxless method of claim 1 wherein said forcing by pressure the first and second substrate toward each other comprises passing the metallic solder through the unfilled polymeric liquid and contacting the second pad with the metallic solder with a pressure ranging from about 200 psi to about 500 psi.

10. The fluxless method of claim 1 wherein said increasing the temperature comprises continually increasing the temperature for a period of time ranging from about 10 minutes to about 50 minutes; and said decreasing the temperature comprises continually decreasing the temperature for a period of time ranging from about 2 minutes to about 15 minutes until the temperature reaches around the curing temperature of the unfilled polymeric liquid where it is maintained for a period of time ranging from about 30 minutes to about 90 minutes.

11. The fluxless method of claim 1 wherein said length of the post is from about five to about eight times greater than the thickness of the first pad.

12. The fluxless method of claim 1 wherein said thickness of the first pad ranges from about 4 microns to about 7 microns and said length of the post ranges from about 20 microns to about 56 microns.

13. The fluxless method of claim 12 wherein said thickness of the first pad ranges from about 5 microns to about 6 microns and said length of the post ranges from about 25 microns to about 48 microns.

14. A fluxless method for forming an interconnect assembly comprising:
providing a first semiconductor substrate having connected thereto a first pad and a second pad less than about 0.20 mm from said first pad, a first post and a second post respectively connected to said first pad and to said second pad, a metallic solder disposed on an end of the first post and on an end of the second post;
providing a second semiconductor substrate having connected thereto a second first pad and a second second pad less than about 0.20 mm from said second first pad;
depositing an unfilled polymeric liquid on the second first pad and on the second second pad;
aligning and contacting the respective metallic solder on the ends of the first and second posts with the second first pad and the second second pad; and
forcing by pressure the first and second semiconductor substrate toward each other while simultaneously heating the respective metallic solders and unfilled polymeric liquids to form a metallurgical joint between the respective metallic solders and the second first pad and the second second pad, wherein said heating the metallic solder and the unfilled polymeric liquid comprises increasing the temperature of the metallic solder until the temperature of the metallic solder is greater than its melting temperature and subsequently decreasing the temperature of the metallic solder and the unfilled polymeric liquid until the temperature is around the curing temperature of the unfilled polymeric liquid.

15. The fluxless method of claim 14 wherein said unfilled polymeric liquid consists essentially of from about 96% by weight to about 98% by weight of an epoxy resin and from about 2% by weight to about 4% by weight of an imidazole catalyst.

16. The fluxless method of claim 15 wherein said unfilled polymeric liquid remains a liquid while said metallic solder is being aligned and contacted with the unfilled polymeric liquid.

17. The fluxless method of claim 16 wherein said forcing by pressure the first and second substrate toward each other comprises passing the metallic solder through the unfilled polymeric liquid and contacting the second first pad and the second second pad with the respective metallic solders with a pressure ranging from about 200 psi to about 500 psi.

18. The fluxless method of claim 17 wherein said increasing the temperature comprises continually increasing the temperature for a period of time ranging from about 10 minutes to about 50 minutes; and said decreasing the temperature comprises continually decreasing the temperature for a period of time ranging from about 2 minutes to about 15 minutes until the temperature reaches around the curing temperature of the unfilled polymeric liquid where it is maintained for a period of time ranging from about 30 minutes to about 90 minutes.

19. The fluxless method of claim 18 wherein said first and second posts include respectively a length which is from about five to about eight times greater than a respective thickness of the first pad and the second pads.

20. The fluxless method of claim 14 wherein said unfilled polymeric liquid consists essentially of from about 60% by weight to about 90% by weight of an epoxy resin; from about 8% by weight to about 36% by weight of a novolac resin; and from about 2% by weight to about 4% by weight of an imidazole catalyst.

21. The fluxless method of claim 14 wherein said unfilled polymeric liquid remains a liquid while said metallic solder is being aligned and contacted with the unfilled polymeric liquid.

22. The fluxless method of claim 14 wherein said forcing by pressure the first and second substrate toward each other comprises passing the metallic solder through the unfilled polymeric liquid and contacting the second first pad and the second second pad with the respective metallic solders with a pressure ranging from about 200 psi to about 500 psi.

23. The fluxless method of claim 14 wherein said increasing the temperature comprises continually increasing the temperature for a period of time ranging from about 10 minutes to about 50 minutes; and said decreasing the temperature comprises continually decreasing the temperature for a period of time ranging from about 2 minutes to about 15 minutes until the temperature reaches around the curing temperature of the unfilled polymeric liquid where it is maintained for a period of time ranging from about 30 minutes to about 90 minutes.

24. The fluxless method of claim 14 wherein said first and second posts include respectively a length which is from about five to about eight times greater than a respective thickness of the first pad and the second pads.

25. The fluxless method of claim 14 wherein said first and second pads include respectively a thickness ranging from about 4 microns to about 7 microns and said first and second posts include respectively a length ranging from about 20 microns to about 56 microns.

26. The fluxless method of claim 25 wherein said thickness of the first and second pads ranges from about 5 microns to about 6 microns and said length of the first and second posts ranges from about 25 microns to about 48 microns.

* * * * *